United States Patent
Wodrich et al.

(10) Patent No.: US 7,521,791 B2
(45) Date of Patent: Apr. 21, 2009

(54) METHOD AND APPARATUS FOR DISSIPATING HEAT FROM AN INTEGRATED CIRCUIT

(75) Inventors: Justin R. Wodrich, Plantation, FL (US); Michael S. Beard, Boca Raton, FL (US); Hal R. Canter, Weston, FL (US); Anbuselvan Kuppusamy, Plantation, FL (US); Zalman Schwartzman, Rehovot (IL); James L. Stephens, Pembroke Pines, FL (US); Kevin C. Farrell, Wellington, FL (US); Kathleen Farrell, legal representative, Wellington, FL (US)

(73) Assignee: Motorola, Inc., Schaumburg, IL (US)

( * ) Notice: Subject to any disclaimer, the term of this patent is extended or adjusted under 35 U.S.C. 154(b) by 178 days.

(21) Appl. No.: 11/370,631

(22) Filed: Mar. 8, 2006

(65) Prior Publication Data

US 2007/0210820 A1    Sep. 13, 2007

(51) Int. Cl.
*H01L 23/10*    (2006.01)
*H01L 23/34*    (2006.01)

(52) U.S. Cl. .................. 257/706; 257/703; 257/718; 257/720

(58) Field of Classification Search ......... 257/666–678, 257/706–717, E23.001, E23.008, E23.031, 257/E23.06
See application file for complete search history.

(56) References Cited

U.S. PATENT DOCUMENTS

| 5,473,425 | A | 12/1995 | Tokumaru et al. |
| 5,949,649 | A | 9/1999 | Bartlow |
| 6,326,678 | B1 * | 12/2001 | Karnezos et al. ............. 257/666 |
| 6,873,043 | B2 | 3/2005 | Oman |

OTHER PUBLICATIONS

PCT International Search Report for Application No. PCT/US2007/063556, Dated Dec. 8, 2008 - 7 pages.

* cited by examiner

*Primary Examiner*—Cuong Q Nguyen
(74) *Attorney, Agent, or Firm*—Barbara R. Doutre

(57) ABSTRACT

An apparatus (100) is provided for dispersing heat from an integrated circuit (202) to a heat sink (404). The apparatus (100) is formed on a nonconductive body (102) having at least two conductive surfaces (110, 112) disposed thereon. One of the conductive surfaces (110) is reflowed to a heat generating lead of the integrated circuit (202), and the other conductive surface (112) provides a surface for contacting a heat sink (404). The apparatus (100) and integrated circuit provide a package (200) which can be tape and reeled (300) for easy mounting to a printed circuit board (402) of a communication device (400).

17 Claims, 5 Drawing Sheets

METHOD AND APPARATUS FOR DISSIPATING HEAT FROM AN INTEGRATED CIRCUIT

FIELD OF THE INVENTION

The present invention relates apparatus and techniques used for thermal dissipation of electronic components.

BACKGROUND

High power telecommunication devices typically include a transmitter line-up including leaded high power electronic components. For example, multi-stage amplifier circuits are used to meet high level power requirements utilizing one or more high power amplifier transistors. The impedance, current drain and hence the efficiency of these components vary with frequency and transmit power level.

High power electronic components soldered to circuit boards, particularly circuit boards of portable devices, face issues with thermal dissipation and efficiency. Heat sinks are used in conjunction with these components to facilitate thermal dissipation, but depending on the load presented to the component, a parameter known as voltage standing wave ratio (VSWR) is created in the transmit path which introduces local heating of other devices on the circuit board. Depending on the magnitude and phase of the load, at certain frequencies, a significant amount of heating can occurs on the leads of the component. The heating, along with repeated cycles of transmit and receive, cause solder joints between the leads of the component and the circuit board to fail. This failure is characterized by a formation of cracks that propagate throughout the solder joint until the joint is completely cracked. The result is an open impedance at the component lead resulting in arcing and failure of the device and circuit board.

Accordingly, there is a need to reduce the propensity of the solder joints to crack and fail during cyclic loading of a leaded high power component.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
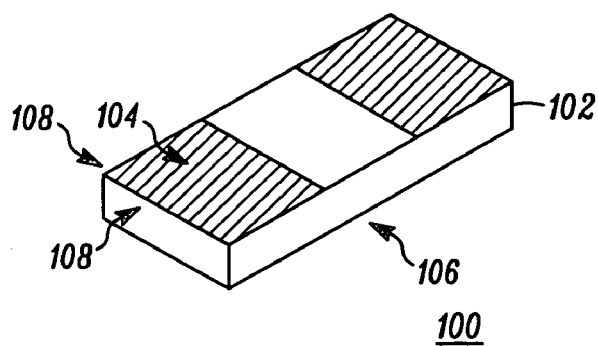
FIG. 1 shows an isometric view of an apparatus formed in accordance with the present invention for dispersing heat from an integrated circuit to a heat sink.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of apparatus components and method steps related to thermal dissipation of high power integrated circuits. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 2:
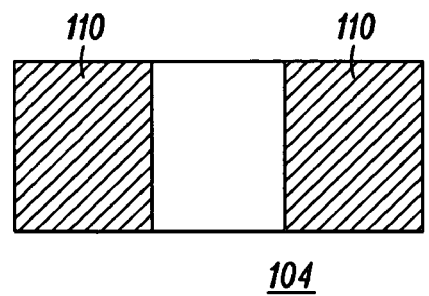
FIGS. 2, 3 and 4 show bottom, top, and side views of the apparatus of FIG. 1 respectively.
Figure 3:
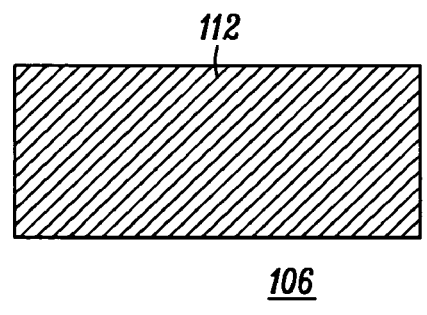
Figure 4:
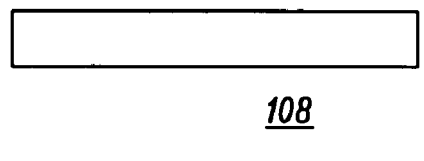

FIG. 1 shows an isometric view of an apparatus 100 formed in accordance with the present invention for dispersing heat from an integrated circuit to a heat sink. FIGS. 2, 3 and 4 show bottom, top, and side views of apparatus 100 respectively. In accordance with the present invention, apparatus 100 comprises a nonconductive body 102 having bottom 104, top 106, and side surfaces 108. In accordance with the present invention, the bottom surface 104 is plated to contact at least one lead of the IC, and the top surface 106 is plated with a conductive material to allow the nonconductive bdy to be reflowed to the leads of the IC with solder. The nonconductive body 102 is formed of a non-electrically conductive material selected based on thermal conductivity, electrical resistivity and dielectric strength. The nonconductive body 102 is preferably comprised of a ceramic material while the bottom and top surfaces 104, 106 are plated to provide electrically conductive and solderable surfaces 110, 112.

Apparatus 100 includes at least two conductive surfaces 110, 112 disposed thereon. In the embodiment shown in FIG. 2 conductive surface 110 is selectively plated to align two independent leads of an IC needing thermal dissipation. The apparatus 100 of the present invention can, however, be plated to accommodate one or more leads of an IC needing thermal dissipation.

As will be shown in the figures to follow, at least one of the conductive surfaces, here conductive surfaces 110, couple to at least one lead of an integrated circuit, and the other conductive surface 112 provides a surface for contacting a heat sink.

In accordance with the present invention, bottom surface 104 can be selectively plated to provide plated geometries that align with and are reflowable to a plurality of heat generating leads of the IC without shorting the leads together. The bottom surface 104 of the substrate body 102 provides thermal dissipation from the plurality of leads to the top surface plating 106 through the substrate body 102. For the purposes of this application apparatus 100 will also be referred to as a heat dispersive apparatus or a heat dispersive member.

Figure 5:
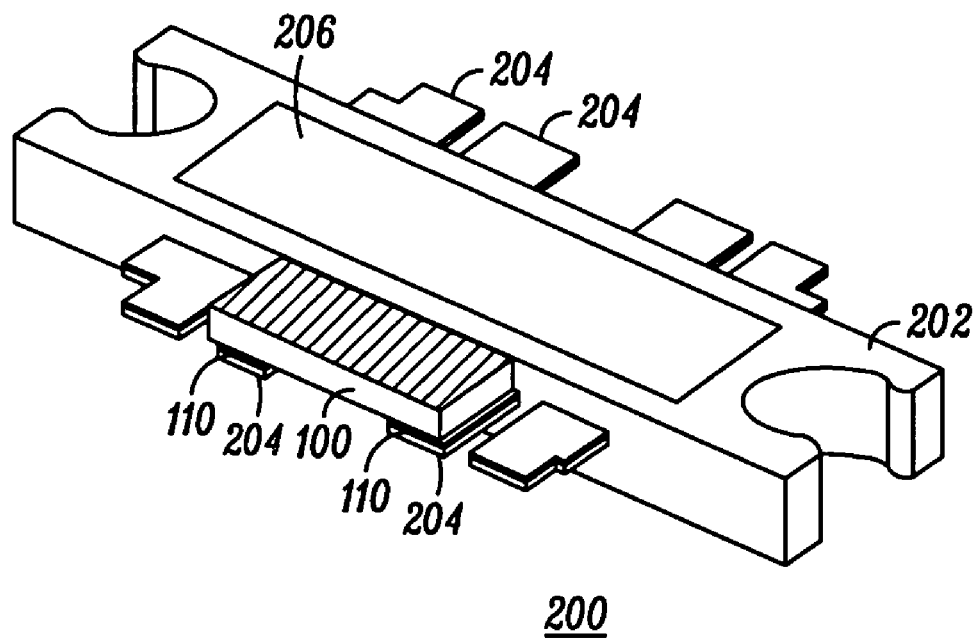
FIG. 5 is an isometric view of a package formed of an integrated circuit with the heat dispersive apparatus of FIG. 1 coupled thereto in accordance with the present invention.

Referring to FIG. 5, there is shown an isometric view of a package 200 formed of an integrated circuit (IC) 202 with the heat dispersive apparatus 100 of FIG. 1 coupled thereto in accordance with the present invention. In accordance with the present invention, at least one of the conductive surfaces is reflowed to at least one lead of a plurality of leads 204 of the integrated circuit 202. This view also shows the plating 106 of heat dispersive apparatus 100 in alignment and co-located next to a metallized tab 206 located on top of IC 202.

Figure 6:
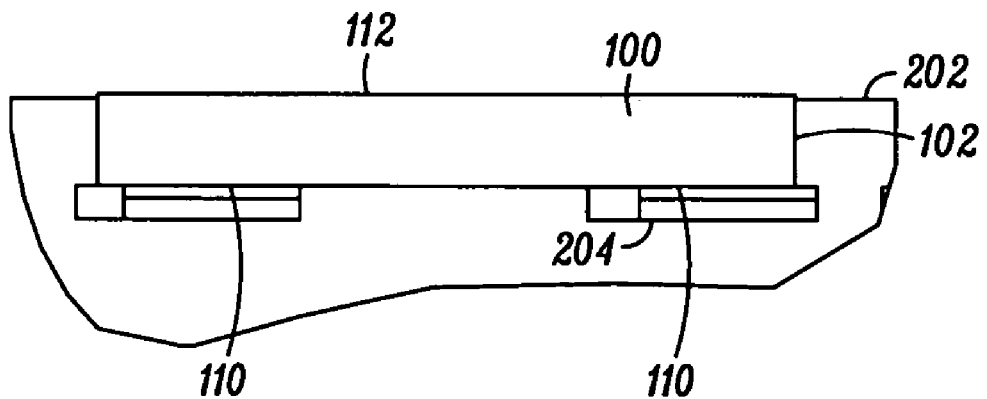
FIG. 6 is partial side view of the package of FIG. 5.
Figure 7:
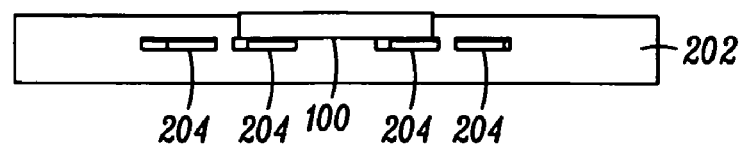
FIG. 7 is full side view thereof.

FIG. 6 is a partial side view of the package of FIG. 5. FIG. 6 shows the top surface plating 112 of the substrate body 102 aligning with a top surface of the IC 202 while the selective plating 110 of the bottom surface 104 is reflowed to two of the plurality of leads 204. FIG. 7 provides a full side view with heat dispersive apparatus 100 mounted to two independent leads of the plurality of leads 204. This view also show apparatus 100 aligning with the top surface of IC 202.

Figure 8:
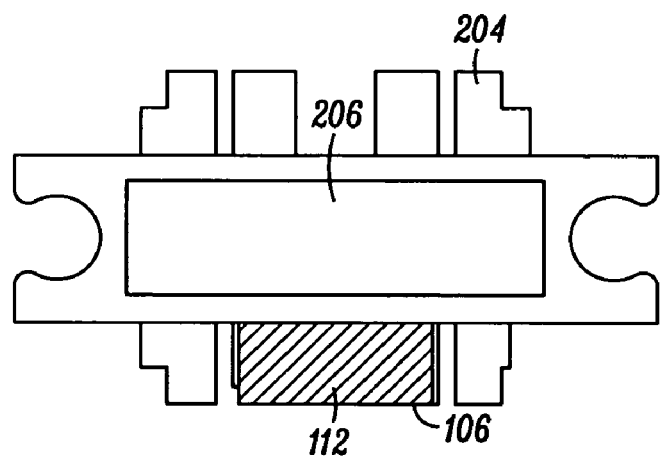
FIG. 8 is top view thereof.
Figure 9:
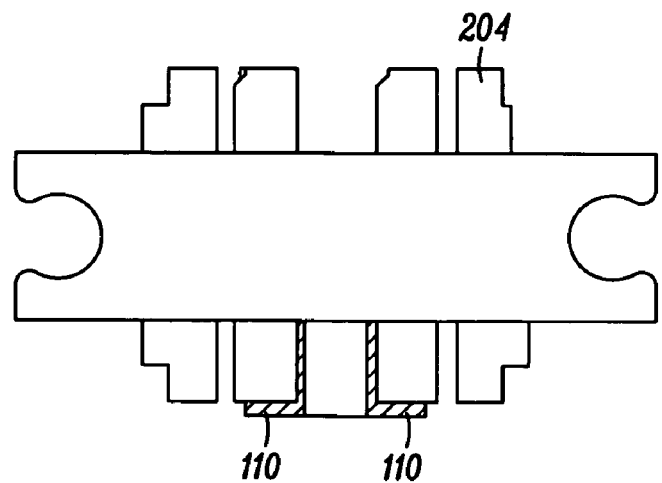
FIG. 9 is a bottom view thereof.

FIG. 8 shows a top view of apparatus 100 mounted to IC 202. This view further shows the top surface's 106 plating 112 of heat dispersive apparatus 100 and metallization tab 206 of IC 202 surrounded by the plurality of leads 204. FIG. 9 is a bottom view 204 of FIG. 5 showing the plurality of leads 204, two of which are soldered to the bottom surface plating 110.

The plurality of leads 204 extending from IC 202 provide a predetermined footprint. The heat dispersive apparatus of the present invention can be formed by determining which leads of an integrated generate heat, and providing a heat dispersive substrate having top, bottom and side surfaces plated such that the substrate provides independent conductive surfaces, with at least one conductive surface providing a geometry that aligns with the footprint of the IC lead(s) that generate heat. Thus, a heat dispersive member formed in accordance with the present invention can be designed to accommodate a variety of footprints and form factors.

Figure 10:
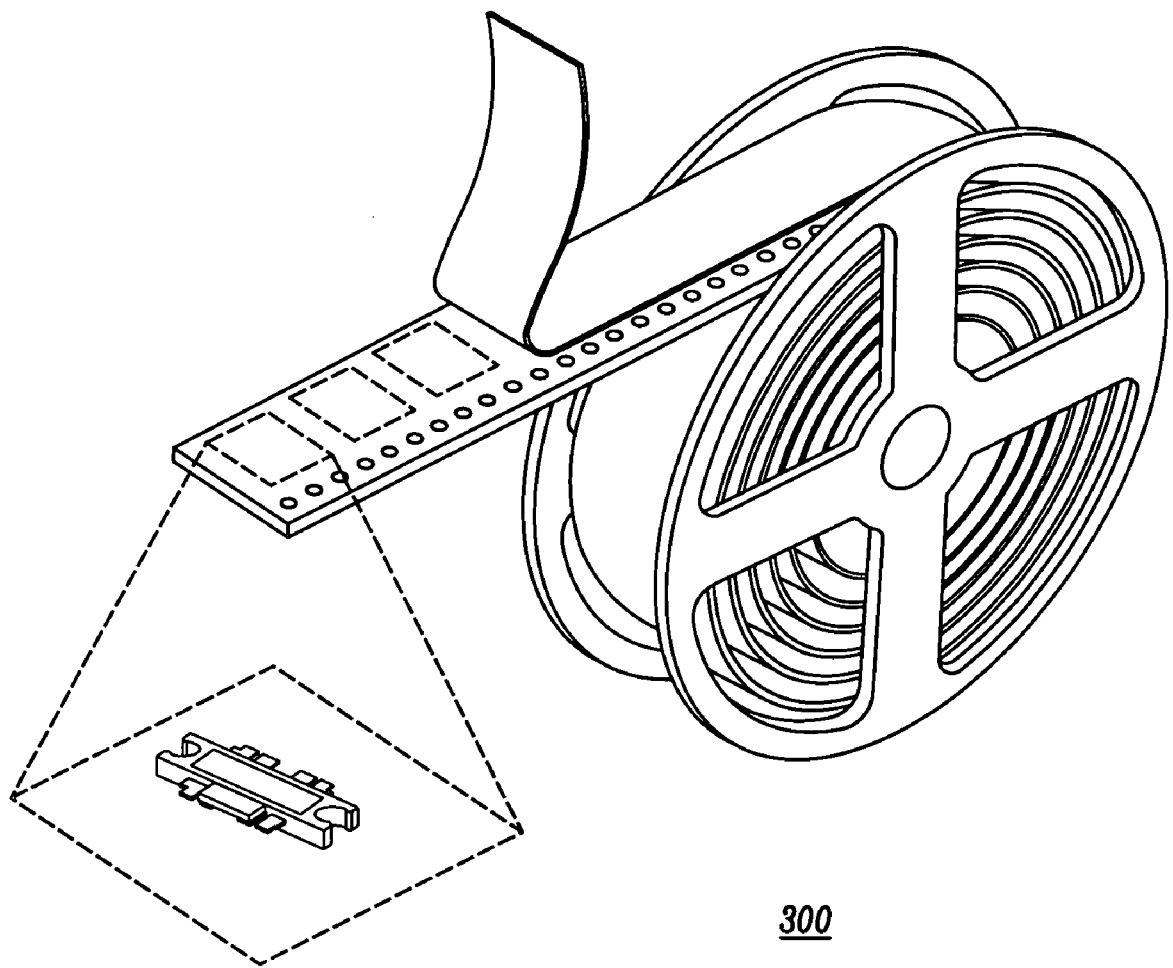
FIG. 10 shows the package of FIG. 5 in tape and reel.

The package 200 formed in accordance with the present invention provides a variety of benefits including improved ease of assembly, low cost and improved thermal conductivity. From a manufacturing standpoint, the package 200 can be assembled into a product using automated equipment. FIG. 10 shows package 200 with the IC 202 and heat dispersive apparatus 100 coupled thereto in a tape and reel format 300 which can be used for automated placement of the package on a printed circuit board.

Figure 11:
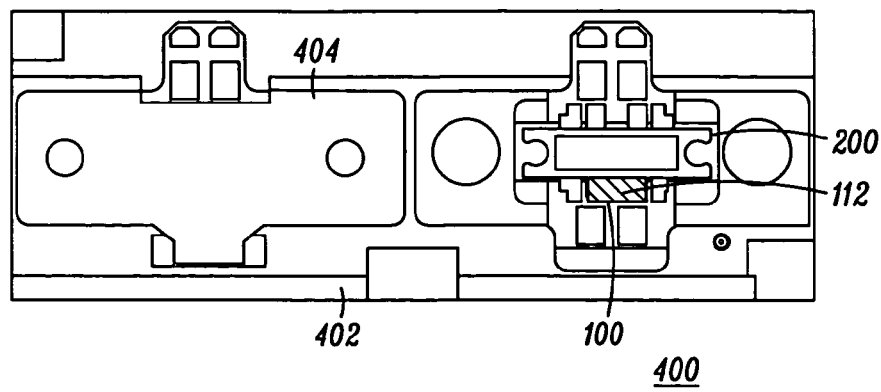
FIG. 11 shows a communication device in which the package of FIG. 5 is mounted on a printed circuit board (pcb) (on the right) and also with a heat sink deposited thereon (on the left)

FIG. 11 shows a communication device 400 in which the package 200 of FIG. 5 is mounted on a printed circuit board (pcb) 402 (on the right) and also with a heat sink 404 deposited thereon (on the left). In accordance with the present invention, communication device 400 includes package 200 formed of the integrated circuit (IC) 202 having a predetermined footprint and heat dispersive member 100 coupled thereto. The package 200 is soldered to the pcb 402 and the heat sink 404 is mounted to the board such that heat dispersive member 100 is coupled in between the IC 202 and the heat sink.

Again, the conductive surfaces of heat dispersive member 100 align with at least a portion of the IC's predetermined footprint that generates heat. The heat dispersive member 100 is soldered to at least one lead of the IC via at least one conductive surface and makes contact with the heat sink 402 via the other conductive surface 112. The heat sink 404 is coupled to the printed circuit board 402 using standard soldering techniques. Heat sink 404 makes contact with both plating 112 of the heat dispersive member 100 and the metallization tab 206 of the IC 202. The thermal conductivity, electrical resistivity and dielectric strength of the heat dispersive member 100 prevent failure of the IC 202 over high temperatures as heat from heat generating lead(s) is dispersed through the dispersive member to the heat sink 402. Heat is thus dispersed through both the plating 112 and metallization tab 206.

Figure 12:
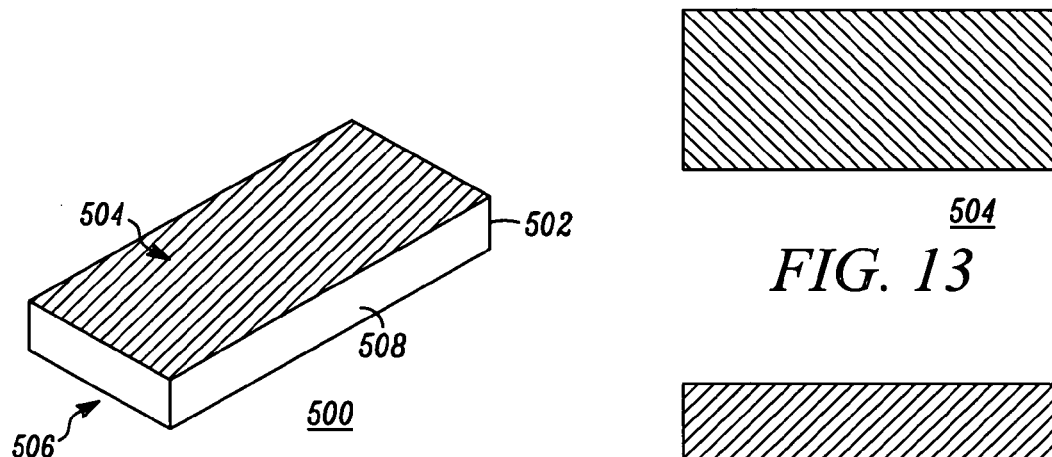
FIG. 12 shows an isometric view of another plating option for the dispersive heating apparatus of FIG. 1 in accordance with an alternative embodiment of the invention.
Figure 13:
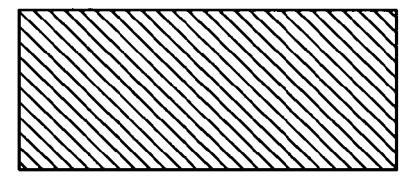
FIGS. 13-15 show top, bottom and side views thereof.
Figure 14:
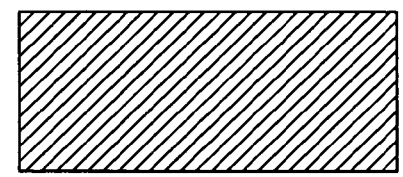
Figure 15:
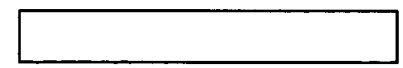

Heat dispersive apparatus 100 can be formed to accommodate a wide variety of IC footprints through the use of selective plating such that independent signal leads are not shorted together. While the apparatus of FIG. 1 is shown being selectively plated 110 on the bottom surface 104 to align with and mate to a portion of the IC footprint that generates heat, other embodiments of the heat dispersive member can be formed with or without selective plating. For example, heat from ICs formed with wider leads can be dispersed using a heat dispersive apparatus that has solid plating on one side. FIG. 12 shows an isometric view of this alternative plating option in accordance with an alternative embodiment of the invention. In this embodiment, heat dispersive member 500 is similar to that of FIG. 1 except that the top and bottom surfaces 504, 506 of nonconductive body 502 are completely plated. FIGS. 13-15 show top, bottom and side views thereof 504, 506 508. Thus, heat dispersive member 500 can be soldered to a wide lead or multiple leads of an IC that can be shorted together, thereby providing an even larger area through which to disperse heat.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. An apparatus for dispersing heat from an integrated circuit to a heat sink, comprising:
   a non-electrical conductive body having at least two heat conductive surfaces disposed thereon; and
   wherein at least one of the heat conductive surfaces is selectively plated to provide a geometry that aligns with and is reflowable to at least one lead of the integrated circuit without shorting the at least one lead to any other leads, and the other heat conductive surface providing a surface for contacting the heat sink.

2. The apparatus of claim 1, wherein the non-electrical conductive body comprises a ceramic material.

3. The apparatus of claim 2, wherein the heat conductive surfaces are comprised of metal plating.

4. The apparatus of claim 3, wherein at least one of the heat conductive surfaces is reflowed to the at least one lead of the integrated circuit.

5. The apparatus of claim 1, wherein the non-electrical conductive body is formed of a material selected based on thermal conductivity, electrical resistivity and dielectric strength.

6. An integrated circuit (IC) package, comprising:
a body having a plurality of leads extending therefrom; and
a non-conductive substrate having first and second heat conductive portions disposed thereon, the first heat conductive portion being selectively plated to provide a geometry that aligns with and is reflowable to at least one of the plurality of leads without shorting to other leads and the second heat conductive portion providing a surface for dispersing heat to a heat sink.

7. The IC package of claim 6, wherein the IC package is tape and reeled.

8. An apparatus for dispersing heat from an integrated circuit (IC), the apparatus comprising:
a substrate body having bottom, top and side surfaces, the bottom surface being plated to contact at least one lead of the IC, and the top surface being plated for dispersing heat generated from the IC, wherein the bottom surface is selectively plated to provide geometries that align with and are reflowable to a plurality of leads of the IC without shorting the leads together.

9. The apparatus of claim 8, wherein the selective plating of the bottom surface of the substrate body provides heat dispersion from the plurality of leads to the top surface plating through the substrate body.

10. The apparatus of claim 9, wherein the top surface plating of the substrate body aligns with a top surface of the IC when the selective plating of the bottom surface is reflowed to the plurality of leads.

11. The apparatus of claim 10, wherein the top surface plating of the substrate body disperses heat to a heat sink disposed on the top surface plating.

12. The apparatus of claim 11, wherein the heat sink is coupled to a printed circuit board.

13. A communication device, including:
an integrated circuit (IC) having a predetermined footprint;
a heat sink;
and a heat dispersive member coupled between the IC and the heat sink, the heat dispersive member having a non-electrical body with conductive surfaces disposed thereon, the conductive surfaces being selectively plated to provide geometries that align with and are reflowable to at least a portion of the IC's predetermined footprint that generates heat without shorting leads of the IC together.

14. The communication device of claim 13, wherein the heat dispersive member is soldered to at least one lead of the IC via at least one conductive surface and makes contact with the heat sink via another conductive surface.

15. The communication device of claim 14, further comprising a printed circuit board (pcb), the heat sink being coupled to the pcb.

16. The apparatus of claim 15, wherein the heat dispersive member is formed of a material selected based on thermal conductivity, electrical resistivity and dielectric strength.

17. The apparatus of claim 16, wherein the thermal conductivity, electrical resistivity and dielectric strength of the material are selected so as to prevent failure of the IC over a predetermined temperature range.

* * * * *